United States Patent [19]

Fulton et al.

[11] Patent Number: 4,666,556

[45] Date of Patent: May 19, 1987

[54] TRENCH SIDEWALL ISOLATION BY POLYSILICON OXIDATION

[75] Inventors: Inge G. Fulton, Washingtonville; James S. Makris, Wappingers Falls; Victor R. Nastasi, Hopewell Junction; Anthony F. Scaduto, Newburgh; Anne C. Shartel, Pleasant Valley, all of N.Y.

[73] Assignee: International Business Machines Corporation, Armonk, N.Y.

[21] Appl. No.: 861,886

[22] Filed: May 12, 1986

[51] Int. Cl.[4] ............ H01L 21/306; B44C 1/22; C03C 15/00; C03C 25/06

[52] U.S. Cl. ................... 156/643; 148/187; 148/DIG. 50; 29/576 W; 29/580; 156/646; 156/648; 156/653; 156/657; 156/661.1; 156/662; 357/49; 357/55; 357/59; 427/86; 427/93

[58] Field of Search ........... 148/1.5, 187, DIG. 50; 29/576 W, 580; 156/643, 646, 648, 653, 657, 659.1, 661.1, 662; 427/93, 94, 85, 86; 357/49, 55, 59

[56] References Cited

U.S. PATENT DOCUMENTS

| | | | |
|---|---|---|---|
| 3,966,577 | 6/1976 | Hochberg | 204/192 |
| 4,104,086 | 8/1978 | Bondur et al. | 148/1.5 |
| 4,139,442 | 2/1979 | Bondur et al. | 204/192 E |
| 4,222,792 | 9/1980 | Lever et al. | 148/1.5 |
| 4,238,278 | 12/1980 | Antipov | 156/657 |
| 4,256,514 | 3/1981 | Pogge | 148/1.5 |
| 4,356,211 | 10/1982 | Riseman | 427/85 |
| 4,509,249 | 4/1985 | Goto et al. | 29/576 W |
| 4,544,576 | 10/1985 | Chu et al. | 427/82 |
| 4,571,819 | 2/1986 | Rogers et al. | 29/576 W |
| 4,582,565 | 4/1986 | Kawakatsu | 156/648 X |
| 4,626,317 | 12/1986 | Bonn | 156/643 |

OTHER PUBLICATIONS

IBM Technical Disclosure Bulletin, vol. 20, No. 1, Jun. 1977, pp. 144–145, "Recessed Oxide Isolation Process" by S. A. Abbas.
IBM Technical Disclosure Bulletin, vol. 21, No. 4, Sep. 1978, pp. 1466–1467, "Method of Etching/Filling Deep Isolation for Large–Scale Integrated Devices", by J. S. Logan et al.
IBM Technical Disclosure Bulletin, vol. 25, No. 2, Jul. 1982, pp. 588–589, "Post Emitter Polysilicon Trench Isolation", by I. Antipov.
IBM Technical Disclosure Bulletin, vol. 25, No. 5, Oct. 1982, pp. 2288–2291, "Method of Forming Polysilicon--Filled Isolation Regions in an Integrated Circuit Device" by N. G. Anantha et al.

Primary Examiner—William A. Powell
Attorney, Agent, or Firm—T. Rao Coca

[57] ABSTRACT

Disclosed is a process of growing a conformal and etch-resistant silicon dioxide on a surface by forming a conformal layer of polysilicon and subjecting the polysilicon to thermal oxidation to completely convert the polysilicon into (poly) silicon oxide.

Disclosed also is a method of forming an isolation trench in a semiconductor substrate having a high integrity oxide sidewall. After forming the trench in the substrate surface using a suitable etch mask and RIE, a single (thermal) oxide or dual (thermal) oxide and (CVD) nitride liner is formed on all trench surfaces. A conformal layer of undoped polysilicon is then formed (by. e.g. LPCVD) on the liner. By subjecting to thermal oxidation, the polysilicon is completely converted into a conformal (poly) silicon oxide layer having a thickness about 2.5 times that of the polysilicon layer. The resulting (poly) silicon oxide has the conformality of CVD oxide and the high etch resistance of thermally grown oxide.

Alternatively, prior to forming the (poly) silicon oxide, the polysilicon layer is removed from the trench floor and the substrate surface in order to limit volume expansion of the polysilicon to a single direction perpendicular to the trench walls.

The trench is filled with oxide, epitaxial silicon, polysilicon, polymers or metal, as desired. For achieving substrate contract through the trench, the trench bottom is opened up by RIE. Polysilicon is deposited with in-situ doping at a high temperature to fill the trench and simultaneously diffuse the dopant from the polysilicon fill into the underlying substrate to form a channel stop.

26 Claims, 12 Drawing Figures

TRENCH SIDEWALL ISOLATION BY POLYSILICON OXIDATION

BACKGROUND OF THE INVENTION

The invention relates to a method of forming semiconductor device isolation trenches and, more particularly, to a method of forming trenches having on the walls thereof a high integrity silicon dioxide insulator.

In the integrated circuit (IC) technology it is usually necessary to isolate various active and passive devices in the IC. The preferred isolation is dielectric isolation because it allows butting of the circuit elements against the isolation and thereby result in greater density of packing of the active and passive devices on the IC chip. The art is replete with a variety of dielectric isolation schemes. Within the dielectric isolation arena, dielectric-filled trench isolation has received particular attention because of its ability to meet the basic requirements of an interdevice isolation of being efficient in electrical isolation and space utilization while maintaining good surface planarity. The overall process sequence of trench isolation fabrication consists of four basic process steps: (1) trench formation; (2) trench filling; (3) surface planarization; and (4) excess material removal. In this context, U.S. Pat. No. 3,966,577 to Hochberg discloses a sputter etching method to achieve dielectric isolation using grown or deposited silicon dioxide to fill etched trenches.

IBM Technical Disclosure Bulletin, Vol. 21 (1), page 144, June 1977 by S. A. Abbas entitled "Recessed Oxide Isolation Process" describes a reactive ion etching (RIE) method to make recessed silicon dioxide filled trenches by partially filling the trenches with evaporated polysilicon material and then oxidizing the material.

U.S. Pat. No. 4,104,086 to Bondur et al and assigned to the present assignee (which, incidentally, contains extensive citation of prior isolation techniques) teaches a method of achieving well-filled deep narrow grooves with near vertical walls by employing RIE. The method consists of the formation of slightly tapered narrow trenches cut through buried highly doped silicon regions, thermal oxidation of the trenches and proper filling-in of the remaining trenches with a vapor deposited dielectric material. This patent emphasizes the need for for forming slightly tapered walls and then addresses the dependency of the quality and planarity of the dielectric filling material on the trench taper angle and trench width. This patent also employs a back etching (by RIE) of the filling material which covers the total wafer to remove the material everywhere from the surface to leave only the isolation pockets.

U.S. Pat. No. 4,139,442 to Bondur et al and assigned to the present assignee teaches a method of simultaneously making both shallow and deep recessed oxide isolation trenches. Shallow and deep trenches of equal narrow width are formed in the silicon substrate by RIE followed by thermally oxidizing the vertical trench walls to completely fill the trenches.

U.S. Pat No. 4,222,792 to Lever et al and assigned to the present assignee discloses a method of forming a deep wide dieletric-filled isolation trench. In this method a wide trench is formed in the surface of a silicon substrate, a thin oxide layer is formed on the trench walls by thermal oxidation of the trench and a layer of organic glass resin in a solvent is spin coated over the surface of the substrate and within the trench. The resin glass within the trench is exposed to an electron beam to render the glass within the trench impervious to a developing solvent. The remainder of the resin glass is stripped away by developing in a solvent, and the resin glass plug within the trench is converted to silicon dioxide by heating in an oxygen ambient. Finally, a layer of silicon dioxide is deposited over the entire surface of the substrate and etched away to planarize the trench.

IBM Technical Disclosure Bulletin Vol. 21 (4) pages 1466–1467, September 1978 entitled "Method of Etching/Filling Deep Trench Isolation for Large-Scale Integrated Devices" by Logan et al discloses use of magnesium oxide as a combination of etch mask and lift-off mask during oxide-filled trench fabrication. A trench is formed in a silicon substrate by RIE using MgO layer having a trench pattern. An oxide is grown on the exposed surfaces of the trench. The trench is filled by sputter depositing $SiO_2$ to a depth less than the trench depth. The oxide sputtered in the device areas is removed by lift-off by dissolving the MgO layer.

U.S. Pat. No. 4,238,278 to Antipov and assigned to the present assignee discloses forming deep and shallow trenches in a silicon substrate. Deep trenches are formed by RIE in the substrate. The trenches are partially filled with oxide by a combination of thermal oxidation of the trench surfaces and chemical vapor deposition (CVD). Filling of deep trenches is completed by the deposition of polysilicon to the surface level of the CVD oxide. Shallow trenches are then etched in the substrate and the exposed silicon and polysilicon corresponding to the shallow and deep trenches, respectively, is thermally oxidized.

U.S. Pat. No. 4,356,211 to Riseman and assigned to the present assignee describes a method of forming air-dielectric isolation regions in silicon. Trenches are formed in the silicon substrate by RIE after having etched openings in an oxide-nitride dual layer on the substrate surface. The surfaces of the trenches are oxidized prior to depositing polycrystalline silicon on the trench sidewalls and on the walls defining the openings in the dual layer. By selectively doping the portion of the polysilicon on the walls of the openings in the dual layer so that this polysilicon will oxidize at a faster rate than the polysilicon on the trench walls, thermal oxidation causes the polysilicon to close in the upper end of each of the trenches while leaving an air space therebeneath to form the dielectric isolation regions.

U.S. Pat. No. 4,544,576 to Chu et al and assigned to the present assignee discloses deep glass-filled trench isolation. After forming trenches in a silicon substrate by RIE, an oxide trench liner is grown. A glass having a coefficient of thermal expansion closely matching that of the substrate is deposited to entirely or partially fill the trench. The structure is then fired until the glass particles fuse into a continuous glass layer and final smoothing if necessary is accomplished.

U.S. Pat. No. 4,571,819 to Rogers et al describes a method of forming oxide-filled trenches without leaving a void or insufficiently filled trench in the center of the trench. In this method, silicon dioxide trench fill containing 3–9 weight percent of N or P type dopant material is reflowed at 950°–1150° C. to collapse any voids therein and produce surface planarity. An underlaying oxide-polysilicon-nitride layer permits the formation and reflow of the doped oxide and remains in place in the trench.

U.S. Pat. No. 4,509,249 describes a method of fabricating polysilicon-filled trench isolation. After forming a U-shaped groove in a silicon substrate by RIE and thermally oxidizing the trench surfaces to form a thick oxide, undoped polysilicon is deposited to fill the groove. The polysilicon material which is deposited on the substrate surface is etched off while simultaneously recessing the polysilicon in the groove followed by completion of groove filling with bias sputtered oxide.

With the advent of the very large scale integrated circuit and its requirement (due to low dopant concentrations in the substrate material) of establishing electrical contact to the substrate containing the IC at the top side rather than back side thereof for reverse biasing the substrate, filling of trenches with conductive material came into vogue. Doped polysilicon has been favored as the conductive trench fill because it gives rise to minimal crystallographic defect formation during the various subsequent thermal cycles owing to the excellent thermal expansion coefficient compatibility of the polysilicon with the silicon material. In this context IBM Technical Disclosure Bulletin, Vol. 25 (2) pages 588-589, July 1982 by Antipov et al entitled "Post Emitter Polysilicon Trench Isolation" teaches use of doped polysilicon as the trench filling material. After forming all the elements of a bipolar device on a silicon substrate, using an oxide-nitride etch mask, a deep trench is formed in the substrate by RIE. The trench surfaces are oxidized to form a thin oxide layer, followed by deposition of a thin nitride layer. The oxide-nitride layers at the bottom of the trench are removed followed by deposition of doped polysilicon to fill the trench and establish substrate contact via the trench bottom. Excess polysilicon is removed followed by oxidation to convert the top portion of the polysilicon trench fill into a passivation layer.

IBM Technical Disclosure Bulletin, Vol. 25 (5), pages 2288-2291 by Anantha et al entitled "Method of Forming Polysilicon-Filled Regions in an Integrated Circuit Device" discloses a variation of the Antipov et al method where in the trench walls are coated with a CVD oxide and polysilicon trench fill material is recessed substantially below the substrate surface.

U.S. Pat. No. 4,256,514 to Pogge and assigned to the present assignee discloses a process of forming in a silicon substrate deep and shallow oxide-filled trenches in conjunction with polysilicon-filled trenches, the latter for establishing electrical contact with the substrate from the top surface of the substrate. A CVD oxide layer formed on the walls of the polysilicon-filled trenches to provide the necessary dielectric isolation between devices IC.

In the trench isolation technology it is important that the trench liner and the trench-fill material be of high quality and integrity. Particularly in polysilicon-filled trench technology, since interdevice isolation is provided by the insulator layer (invariably, a thick oxide) on the sidewalls of the trench, while the doped polysilicon fill serves as the electrically conductive medium for biasing the substrate, it is imperative that the trench sidewall be of high integrity. However, the prior art methods of forming the trench sidewall oxide insulator, regardless of whether formed by CVD or thermal oxidation have basic shortcomings.

To elaborate on the above shortcomings, reference is made to FIG. 1 wherein is shown a deep trench coated with a CVD oxide. Numeral 10 designates a silicon substrate in which the trench is formed and 12 and 14 designate thin oxide and nitride trench liners, respectively. The CVD oxide sidewall is designated by 16 and the polysilicon fill, which is of the same conductivity type as the substrate 10, by 18. The CVD oxide sidewall insulator 16, although provides excellent conformality desired of trench sidewall, suffers from susceptibility to erosion 20 at the top thereof during the wet (e.g., buffered hydrofluoric acid) etching steps associated with the excess material (invariably, a thermally grown oxide mask) removal step of trench fabrication mentioned hereinabove or with subsequent device fabrication. This erosion of the CVD oxide sidewall 16 occurs because the etch rate of CVD oxide is extremely high (typically, 5-6 times) compared to that of thermally grown oxide. As a result of this erosion, subsequent utilization of the substrate 10 leads to serious electrical shorting problems. For example, in state-of-the-art bipolar device fabrication wherein polysilicon base is defined such that it overlaps the trench, the doped polysilicon base material will fill the narrow grooves 22 forming conductive polysilicon rails embedded therein. This leads to base-to-isolation shorts and leakage through the doped polysilicon rails.

In addition to the vertical erosion during wet etching, the CVD sidewall oxide 16 is also susceptible to lateral erosion. Since the etch rate of the CVD oxide is inherently high, the various etching steps to remove the nitride 14 and oxide 12 from the trench bottom and trench cleaning steps prior to filling with polysilicon 18 tend to thin down the CVD sidewall oxide 16 as indicated by numeral 24 in FIG. 1. Since the thickness of the sidewall insulator 16 is key to the capacitance associated with the trench (the thinner the insulator, the larger is the capacitance), thinning of the sidewall oxide 16 leads to unacceptable trench sidewall capacitance.

One way of minimizing the lateral erosion 24 (FIG. 1) and preserving the trench CVD sidewall oxide thickness is by providing protective layers. However, this adds to the complexity and cost of the trench fabrication process. Likewise, the erosion 20 at the top can be minimized by means of additional barrier layers (such as silicon nitride or sacrificial undoped polysilicon), but at the expense of additional cost and process complexity.

Turning to the shortcomings of the second prior art method of forming the sidewall oxide, viz., by thermal oxidation of the silicon trench, in this method, which involves covering the silicon substrate with an oxidation resistant trench-definition mask, RIE of the trench and a high temperature thermal oxidation of the trench surfaces, the grown oxide is sensitive to the dopant type and concentration variations in the substrate. For example, referring to FIGS. 2A and 2B, wherein the substrate 30 is P type, contains a blanket N+ subcollector layer 32 of a high dopant concentration and an N type epitaxial silicon layer 34 of a lower dopant concentration than the N+ layer 32, uniform oxidation will not take place at the trench sidewalls. Referring to FIG. 2A, due to the higher dopant concentration in the subcollector layer 32, the trench portion corresponding to the layer 32 will undergo enhanced oxidation leading to a distortion 36 of the original trench wall profile. Subsequent etching step to remove the oxide at the trench bottom to facilitate substrate contacting, leads to pinholes, discontinuities and other defects in the oxide sidewall due to localized thinning thereof. Consequently, upon filling the trench with highly (P) doped polysilicon, the P dopant will outdiffuse into the substrate via the pinhole and other defects in the grown sidewall oxide causing the pinch-off defects 40. A similar pinch-off defect 42 will occur, as illustrated in FIG. 2B, at the top of the trench near the interface between the epitaxial layer 34 and the trench-definition mask (not shown) due to thinning of sidewall oxide 44 at the top corners of the trench during the etch steps to remove the oxide 44 at the trench bottom and the trench-definition mask. The pinch-off defects 40 and 42 result in a low isolation breakdown.

The invention solves these and other problems by a novel process which is simple and straight-forward.

It is an object of the invention to provide a high integrity oxide sidewall for trench isolation to alleviate the low trench isolation breakdown characteristic of the prior art.

It is another object of the invention to provide a trench sidewall oxide which exhibits the conformality of a CVD oxide and the etch resistance of thermally grown oxide.

As used herein the phrase "polysilicon oxide" means oxide obtained by a complete thermal oxidation of polysilicon.

SUMMARY OF THE INVENTION

In accordance with the general concept of the invention, a method of forming a highly etch-resistant and uniform silicon dioxide on a oxidizable or non-oxidizable surface is disclosed. This is accomplished by forming a conformal layer of polysilicon on the oxidizable or non-oxidizable surface and subjecting to a thermal oxidation process to completely convert the polysilicon into polysilicon oxide.

In accordance with a specific aspect of the invention, a method of forming isolation trenches having a sidewall polysilicon oxide layer of high integrity. In one embodiment of the method of forming this trench structure, trenches having substantially vertical walls and horizontal floor are formed in a silicon substrate by covering the substrate with a trench-definition mask and reactive ion etching. Undoped polysilicon is deposited to form a conformal layer thereof on all the trench surfaces and the surface of the mask. Polysilicon deposition is preferably by low pressure chemical vapor deposition (LPCVD). The thickness of the polysilicon layer is selected to be about 40% of the thickness of the trench sidewall polysilicon oxide desired. By subjecting to a thermal oxidation process, the polysilicon layer is completely transformed into a uniform polysilicon oxide layer having the conformality of a CVD oxide and etch resistance comparable to that of thermally grown oxide. Trench filling, surface planarization and removal of excess material are then accomplished.

If substrate contact via the trench is desired, polysilicon oxide from the trench floor is removed by RIE. Highly doped polysilicon of the same dopant type as the substrate is deposited to fill the trench followed by thermally diffusing some of the dopant from the polysilicon fill into the underlying substrate to form a leakage channel stop below the trench.

In an alternative embodiment of the process of forming isolation trench structure having a high integrity polysilicon oxide sidewall, after etching the trenches in the substrate, a non-oxidizable insulator trench liner is formed. A conformal undoped polysilicon layer is then formed on the liner and the substrate surface. By RIE, the polysilicon layer is removed from all the horizontal surfaces. The polysilicon remaining on the vertical surfaces of the trench is then converted by thermal oxidation to polysilicon oxide. Since volume expansion of the polysilicon during the conversion to polysilicon oxide is limited to a single direction (i.e., perpendicular to the trench walls), the resulting oxide gives rise to a minimal stress on the substrate.

BRIEF DESCRIPTION OF THE DRAWINGS

The novel features, individual process steps and their combination which are characteristic of the invention are set forth in the appended claims. The invention itself, however, will be best understood by reference to the detailed description which follows in conjunction with the accompanying drawings wherein:

DETAILED DESCRIPTION OF THE PREFERRED EMBODIMENTS

Figure 1:
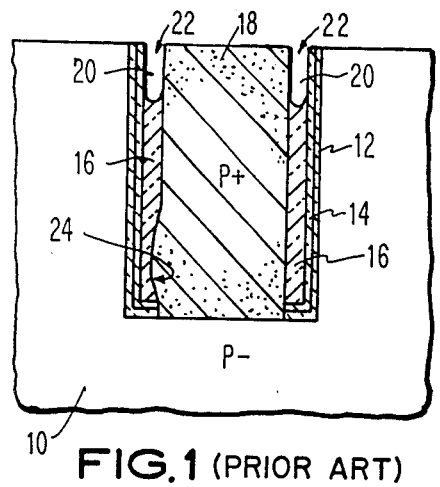
FIG. 1 is cross-sectional representation of a prior art trench isolation structure wherein the trench sidewall oxide is formed by CVD showing the deficiencies of the prior art.
Figure 3:
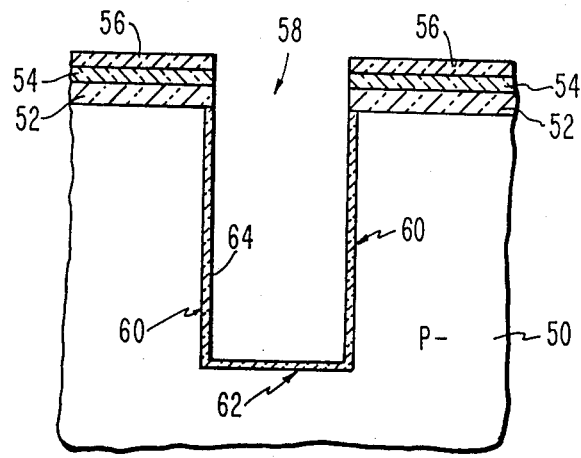
FIGS. 3–8 are flow diagrams illustrating by sequential cross-sectional representation the process of the present invention for forming a trench isolation structure having polysilicon oxide sidewall.
Figure 2B:
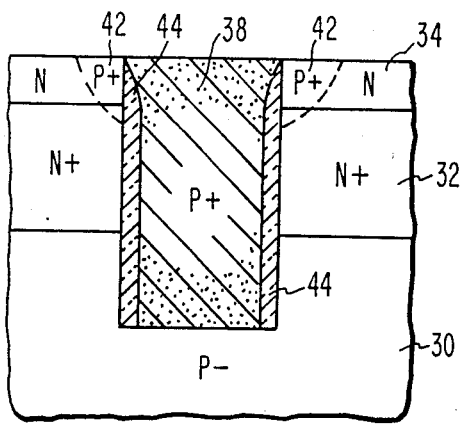
FIGS. 2A and 2B illustrate in a cross-sectional representation a prior art trench structure wherein the trench sidewall oxide is formed by thermal oxidation showing the shortcomings of the prior art.

Referring to the FIGS. 3–8, one embodiment of the invention will now be described. As illustrated in FIG. 3, starting with a P type silicon substrate 50, a triple layer mask consisting of a about 150–200 nm thick silicon dioxide 52, about 80–120 nm thick silicon nitride 54 and about 500–1000 nm thick CVD oxide 56 is formed. The oxide 52 serves as a pad to buffer the stress induced by the nitride 54 on the substrate 50. The nitride serves as an oxidation mask during a later stage of the present fabrication process. The CVD oxide 56, serves, among other things as a mask during the trench etching step.

In the following description a P type silicon substrate is used as an example, but the type of substrate can be altered to N type. The thickness of the various layers may also be altered as desired, depending on the device design. It will also be understood that the substrate material is not limited to silicon. The present process can be applied to other semiconductor substrates for fabricating trench isolation. Also, the drawings are not to scale. The thickness of the various layers are shown for clarity of illustration and should not be interpreted in a limiting sense.

The triple layer 52-54-56 mask is patterned in accordance with the desired trench pattern using conventional lithographic and etching techniques. A trench pattern is then formed in substrate 50 by RIE. Details of the trench etching process are contained in the aforementioned Bondur et al U.S. Pat. No. 4,104,086 which is hereby incorporated by reference herein. For convenience of illustration, only a part of the trench pattern consisting of a single trench 58 is shown in FIG. 3. The trench 58 for device isolation purposes is sufficiently deep and narrow, typically, in the range 1-5 μm and consists of substantially vertical walls 60 and a substantially horizontal floor 62. Next, a high quality surface oxide 64 lining the trench walls is formed to assure a good silicon to silicon oxide interface with low surface state densities. Oxide 64 is typically about 50–70 nm thick and is formed by thermal oxidation of the trench.

Figure 4:
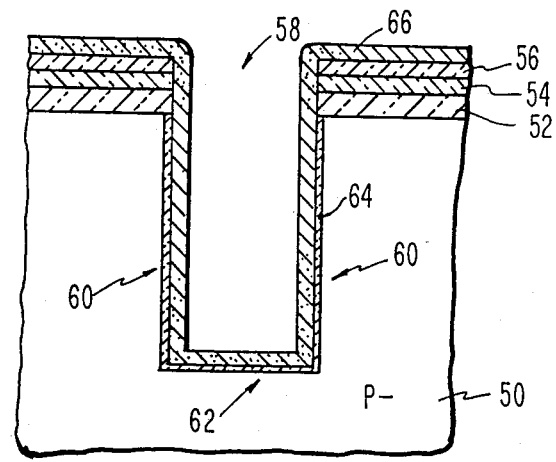
Figure 2A:
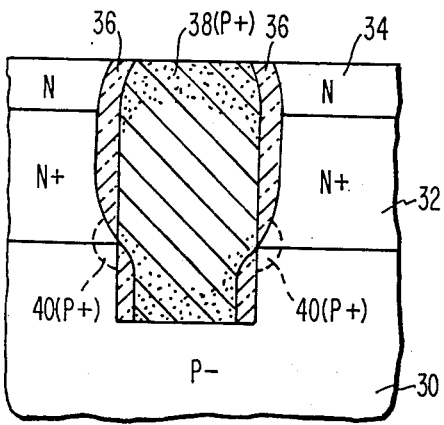

Progressing toward the structure of FIG. 4, a uniformly thick and conformal polysilicon layer 66 is formed by CVD on all the trench surfaces including the oxide-coated vertical and horizontal surfaces 60 and 62, respectively, and on the CVD oxide mask 56. The thickness of the polysilicon layer 66 is adjusted to be equal to approximately 40% of the desired thickness of the trench oxide sidewall, which, in turn, is governed by the collector-base capacitance required of the isolation structure. Typically, the polysilicon 66 thickness is in the range of about 100–150 nm. LPCVD is a preferred method of forming polysilicon 66 since this provides a better conformal coating. Polysilicon 66 is deposited by the pyrolysis of a silicon-bearing gas such as silane and dichlorosilane, typically, in the temperature range 600°–800° C. in an atmospheric pressure system or reduced pressure system at a low pressure of about 100–200 milli torr.

Figure 5:
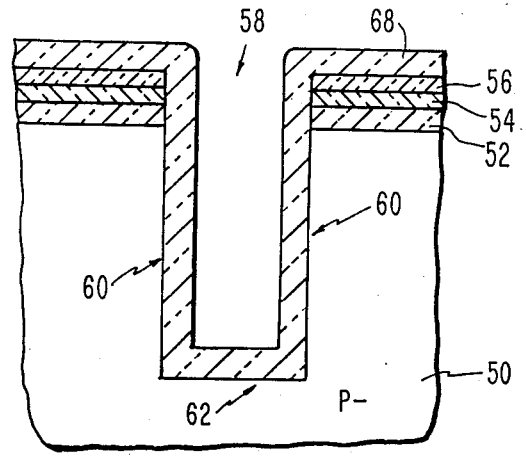

In the next process step, which is illustrated in FIG. 5, the polysilicon 66 is subjected to thermal oxidation to completely convert the polysilicon into a polysilicon oxide 68. Steam oxidation at a temperature of about 900°–1000° C. is employed for this conversion process. Since the silicon source giving rise to the polysilicon oxide 68 is a conformal (polysilicon) layer (66), the oxide 68 will be correspondingly conformal as well. Also, since the polysilicon oxide 68 is obtained by thermal conversion of polysilicon (66), the etch characteristics of the oxide 68 will be as superior as that of oxide grown by thermal oxidation of silicon. The polysilicon oxide 68 will additionally have a high quality which, in conjunction with the oxide liner 64 (which is not shown in FIG. 5 since it is indistinguishable from oxide 68), provides an excellent interface with low surface state densities between the vertical surfaces 60 and horizontal surface 62 of silicon 50 and oxide 68. Thus, by forming a CVD polysilicon as a precursor to the trench sidewall oxide and thermally converting the precursor polysilicon into oxide, is obtained a trench sidewall which exhibits both the conformality of a CVD oxide layer and the high etch resistance of a thermally grown oxide.

The next process step is filling of trench 58. The trench may be filled with any of several different materials. In the case of device applications, the filling material is some form of dielectric material, such as oxides, polymers, epitaxial silicon or polycrystalline silicon. The trench may also be filled with a conductive metal to obtain buried interconnecting device lines.

If contact to substrate 50 is desired, the oxide 68 corresponding to the bottom 62 of the trench 58 needs to be removed prior to filling the trench with a conductive material. This removal is accomplished by vertical RIE using, for example, $CF_4$ etchant gas species. During this RIE step, the oxide 68 formed on the surface of CVD oxide mask 56 is also removed leaving sidewall oxide 68' on the vertical walls of the trench. Next, to ensure that the P type substrate 50 does not invert during the subsequent processing and cause device-to-device leakages, implantation of the trench with P type (e.g., boron) ions may be accomplished. The implant is directed vertically into the trench. Under these conditions, the trench sidewall oxide 68' acts as an efficient mask while the implant in the bottom can reach into the substrate and form a P+ region 72.

In accordance with the invention, the above trench implantation step may be avoided and yet the P+ region 72 can be formed thereby obtaining process cost savings. In this process trench 58 is filled by CVD of in-situ P doped polysilicon 70. Boron is typically used as the dopant for this purpose. CVD of polysilicon is preferred since it facilitates conformal coating, excellent control of the deposition and generally prevents formation of voids in the trench fill. The preferred polysilicon deposition temperature is about 900°–1000° C. and the deposition pressure is about an atmosphere. The polysilicon 70 deposition is continued until a thick (2–3 $\mu$m) surface layer thereof is formed on the substrate covered by mask 56. During the polysilicon 70 deposition step, due to the high temperature of deposition some of the P dopant from the polysilicon 70 will diffuse a sufficient depth into the substrate via the trench bottom 62 into the substrate 50 thereunder forming the highly doped P+ channel stop. Thus, in a single process step, polysilicon 70 trench filling, doping of the trench fill 70 (to a high concentration level) with the same conductivity type dopant as the substrate and diffusion of this dopant into the substrate directly beneath the trench to form the P+ region 72 are accomplished.

Figure 7:
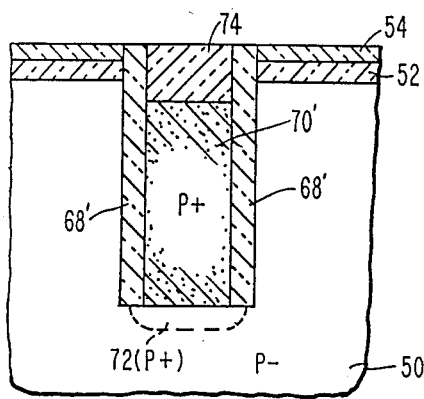

Having completed filling the trench, next as illustrated in FIG. 7, planarization of the substrate surface is accomplished using well-known planarization techniques to remove excess polysilicon 70, i.e. the polysilicon 70 above the level of the surface of substrate 50. Chemical-mechanical polishing may be used to remove the portion of the excess polysilicon 70 above the surface of the nitride layer 54. During this step, the CVD oxide 56 will also be removed and the nitride 54 serves as a polish-stop indicator. The polysilicon trench fill may be recessed, by a suitable etching step such as RIE, below the surface of the substrate 50 followed by subjecting to a thermal oxidation step at a suitable temperature to passivate the top of the trench. Thermal oxidation converts the top portion of the polysilicon trench fill 70' into polysilicon oxide 74, while the remainder of the substrate is protected by the oxidation-resistant nitride 54 mask. The nitride 54 is removed by a wet etching using, for example, hot phosphoric acid. The thermal oxide mask 52 is next removed by either wet etching or dry etching. During the oxide 52 removal step, a surface portion of the polysilicon oxide 74 and an upper portion of the trench sidewall oxide 68' is also removed to a certain extent. However, since the sidewall polysilicon oxide 68' has a high etch resistance (equal to that of the thermal oxide 52) there will be no erosion of the oxide 68' (during the wet etching steps) like was typical in the prior art. The resulting structure, shown in FIG. 8, consists of a trench 58 filled with P+ doped polysilicon 70' having a polysilicon oxide cap 74 and high-integrity sidewall polysilicon oxide 68'. To establish electrical contact with the substrate 50, the oxide cap 74 is selectively opened up using conventional lithography and etching and metallization in contact the P+ polysilicon fill 70' is formed.

Figure 9:
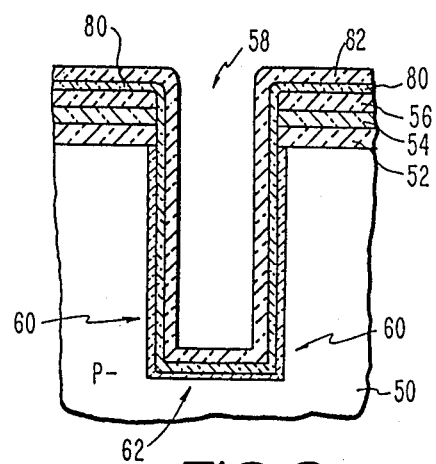
FIGS. 9–11 are cross-sectional representations of forming a trench isolation structure having polysilicon oxide sidewall using an alternative process of the present invention.
Figure 10:
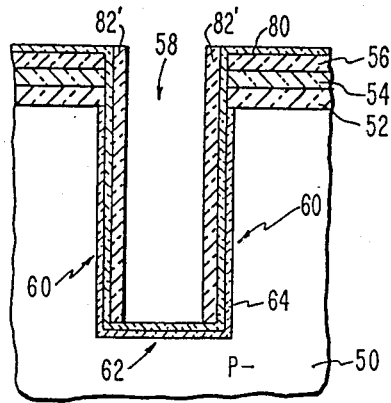
Figure 8:
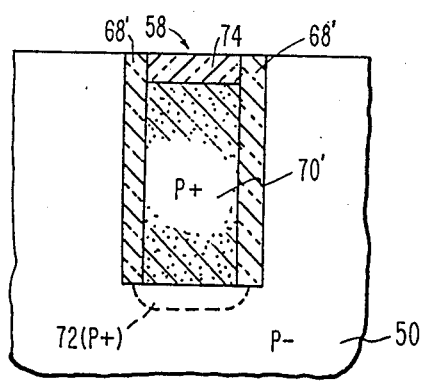
Figure 11:
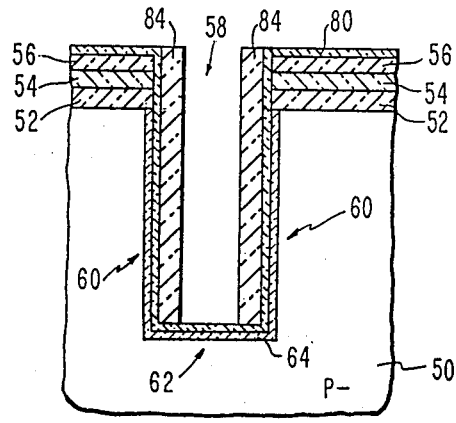

An alternative embodiment of the present fabrication process of forming isolation trench having a high integrity sidewall oxide, is illustrated in FIGS. 9–11. Referring to FIG. 9, in particular, after forming the barrier oxide 60 on the vertical and horizontal surfaces of the trench 58 analogous to that described in connection with the FIG. 3 structure formation, a thin (typically, 50–150 nm thickness) silicon nitride layer 80 is deposited. The nitride 80 will later on serve as an etch stop during polysilicon removal. After forming the nitride 80, undoped polysilicon layer 82 is deposited. The process of forming and the characteristics of the polysilicon 82 are quite similar to those of polysilicon layer 66 described in connection with FIG. 4.

Turning now to the structure of FIG. 10, the polysilicon layer 82 in correspondence with the horizontal surface 62 of the trench 58 and that overlying the horizontal portion of the nitride 80 are removed by vertical RIE. CF4 RIE is preferred. The resulting structure, shown in FIG. 10, will have polysilicon sidewalls 82' in correspondence with only the vertical surfaces 60 of the trench 58. Next, by thermal oxidation in steam at a temperature of 900°–1100° C., the polysilicon 82' is completely converted to polysilicon oxide sidewalls 84 as indicated in FIG. 11. During the thermal conversion of the polysilicon 82' into polysilicon oxide 84 the volume expansion of the polysilicon takes place in a single direction, i.e., perpendicular to the vertical surfaces 60 of the trench 58, the stress created on the substrate 50 (particularly the corners of the trench) by the oxide 84 will be minimal. Minimization of this stress translates into minimization of formation and/or propagation of crystalline defects such as dislocations in the silicon material 50. Thus, in this alternative embodiment, by forming, in a tailor-made fashion, the (poly) silicon source solely on the vertical surface of the trench and obtaining from the silicon source an oxide layer numerous benefits are gained. A trench sidewall oxide 84 is obtained precisely where desired. The oxide 84 has an etch rate matching that of thermally grown oxide and conformality of CVD oxide. Crystalline defects in the silicon substrate are kept at a minimum despite formation of a thick trench sidewall oxide 84.

After forming the polysilicon oxide 84 as shown in FIG. 11, if substrate contact is desired, the oxide 64 and nitride 80 corresponding to the trench bottom 64 is removed by RIE. The remainder of the process including trench filling, planarization and excess material removal tracks that described hereinabove in connection with FIGS. 6–8.

A split lot experiment comparing the frequency of breakdown of trench sidewall oxide formed by prior art thermal oxidation process with that formed by the present polysilicon oxidation process demonstrated significant results. The thickness of the sidewall oxide in both cases was the same, approximately 300 nm. Using one lot of wafers, the polysilicon sidewall oxide was formed by growing a 50 nm thick oxide barrier in the RIE-defined silicon trenches; depositing about 120 nm thick polysilicon layer; and oxidizing the polysilicon into polysilicon oxide. In the second lot of wafers the thermal oxide was formed by straight-forward thermal oxidation of the RIE-defined trenches. Sidewall etching, P+ polysilicon trench filling and planarization were common to both lots of wafers. Breakdown voltage measurement on the sidewall oxide demonstrated that the polysilicon oxide sidewall structures generally have a significantly lower failure rate than that of the thermal oxide sidewall structures.

Thus, there has been provided, in accordance with the invention a process of growing a high-integrity thermal oxide on an oxidizable or non-oxidizable surface that fully satisfies the objectives and advantages set forth above.

Figure 6:
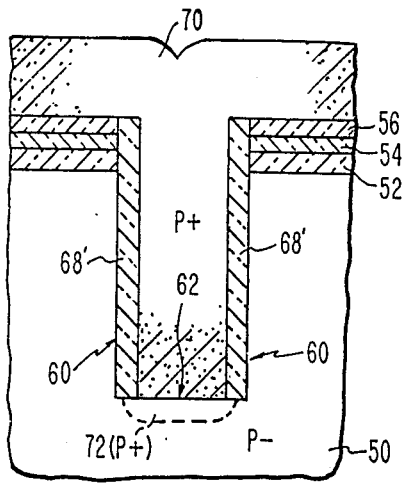

While the invention has been described in conjunction with specific preferred embodiments, it is evident that many alternatives, modifications and variations will be apparent to those skilled in the art in light of the foregoing description. While the invention has been described in conjunction with filling trenches with polysilicon, it is readily adaptable for forming epitaxial filled trenches. Referring to FIG. 6, after exposing the silicon at the trench bottom by removing the polysilicon oxide 68 in correspondence therewith, the silicon crystal 50 is used as seed material to grow epitaxial silicon in the trench. The epitaxial silicon growth will take place on the silicon surface and not on the oxide 68'. It is therefore contemplated that the appended claims will embrace any such alternatives, modifications and variations as fall within the true scope and spirit of the invention.

What is claimed is:

1. A method for thermally growing a uniform, conformal silicon dioxide layer on a non-oxidizable surface comprising:
   forming on said surface a conformal layer of polysilicon; and
   subjecting said polysilicon to thermal oxidation to completely convert said polysilicon to said silicon dioxide layer.

2. The method as recited in claim 1 wherein said polysilicon forming is by deposition.

3. The claim as recited in claim 1 wherein said polysilicon forming is by low pressure chemical vapor deposition.

4. The method as recited in claim 1 wherein the thickness of said polysilicon layer is approximately 40% of the thickness of said silicon dioxide layer.

5. The method as recited in claim 1 wherein said non-oxidizable surface is silicon nitride surface.

6. A method for thermally growing a conformal polysilicon oxide layer on the surface(s) of a groove, comprising:
   providing a semiconductor substrate including a groove therein, said groove having one or more surfaces;
   forming a conformal polysilicon layer on said surfaces; and
   thermally oxidizing to completely convert said polysilicon to polysilicon oxide.

7. The method as recited in claim 6 wherein said polysilicon forming is by chemical vapor deposition (CVD).

8. The method as in claim 7 wherein said CVD is accomplished at a low pressure.

9. The method as recited in claim 6 wherein said groove is either V-shaped or U-shaped.

10. The method as recited in claim 6 wherein said surfaces are coated with a non-oxidizable material.

11. The method as recited in claim 10, wherein said non-oxidizable material is silicon nitride.

12. A process for forming an isolation trench in a semiconductor substrate comprising:
   providing a semiconductor substrate covered with an insulator layer;
   forming a trench having substantially vertical surfaces and substantially horizontal surfaces in said substrate by etching an opening in said insulator layer followed by etching the underlying substrate in correspondence with said opening;
   depositing a conformal layer of polysilicon on said surfaces of the trench;
   thermally oxidizing to completely convert said polysilicon into polysilicon oxide layer; and filling said trench with a material which is compatible with said substrate.

13. The process as in claim 12 further comprising removing said insulator by wet etching.

14. The process as in claim 12 further comprising thermally oxidizing said trench to form a thin oxide trench liner prior to said polysilicon deposition.

15. The process as in claim 12 wherein said polysilicon deposition is by low pressure chemical vapor deposition.

16. The process as in claim 12 where said trench filling comprises:
    removing said polysilicon oxide from said horizontal surfaces and exposing said semiconductor substrate thereunder; and
    depositing doped polysilicon to fill said trench.

17. The process as in claim 16 wherein said doped polysilicon is of the same conductivity type as said substrate.

18. The process as in claim 17 further comprising depositing said polysilicon at a high temperature in the range 900°–1000° C. to simultaneously diffuse some of the dopant from said doped polysilicon into the underlying substrate and form a channel stop below said trench.

19. The process as in claim 18 wherein the thickness of said conformal polysilicon layer is about 40% of said polysilicon oxide layer.

20. A process for forming an isolation trench in a semiconductor substrate comprising:
    providing a semiconductor substrate having on a surface thereof an insulator layer;
    forming a trench in said substrate by etching an opening in said insulator and the underlying substrate in correspondence with said opening;
    depositing a thin conformal layer of polysilicon on the trench walls and floor and on said insulator layer;
    converting said polysilicon layer into polysilicon oxide by thermal oxidation of said polysilicon;
    filling the trench with polysilicon; and
    removing said insulator by wet etching while maintaining in tact said polysilicon oxide on the trench walls near the substrate surface.

21. The process as in claim 20 further comprising:
    thermally oxidizing to form a silicon dioxide liner for said trench; and
    depositing a layer of silicon nitride on said oxide liner.

22. The process as in claim 21 further comprising:
    removing said conformal polysilicon layer by anisotropic reactive ion etching from the floor of said trench and from said insulator layer prior to said conversion of said polysilicon into said polysilicon oxide.

23. The process as in claim 22 wherein said polysilicon filling comprises:
    depositing by chemical vapor deposition polysilicon doped with the same conductivity type dopant as said substrate at a high temperature of about 900°–1000° C. to completely fill said trench and obtain a thick doped polysilicon layer atop said insulator while simultaneously diffusing dopant the polysilicon filling said trench into the substrate in correspondence with said trench forming a channel stop under said trench.

24. The process as in claim 23 further comprising etching to remove said thick polysilicon layer and recessing said polysilicon filling said trench utilizing said nitride as an etch mask.

25. The process as in claim 24 further comprising prior to said wet etching step thermally oxidizing the upper portion of said recessed polysilicon filling said trench to form a polysilicon oxide cap.

26. The process as in claim 20 further comprising prior to filling said trench removing by reactive ion etching the polysilicon oxide layer in said trench bottom.

* * * * *